(12) United States Patent
Ning et al.

(10) Patent No.: US 12,332,310 B2
(45) Date of Patent: Jun. 17, 2025

(54) BUILT-IN TESTING IN MODULAR SYSTEM-ON-CHIP DEVICE

(71) Applicant: Marvell Asia Pte Ltd, Singapore (SG)

(72) Inventors: Xiongzhi Ning, Karlsruhe (DE); Yuyi Tang, Karlsruhe (DE); Steffen Dolling, Ditzingen (DE)

(73) Assignee: Marvell Asia Pte Ltd, Singapore (SG)

( * ) Notice: Subject to any disclaimer, the term of this patent is extended or adjusted under 35 U.S.C. 154(b) by 0 days.

(21) Appl. No.: 18/170,467

(22) Filed: Feb. 16, 2023

(65) Prior Publication Data

US 2023/0258720 A1 Aug. 17, 2023

Related U.S. Application Data

(60) Provisional application No. 63/417,675, filed on Oct. 19, 2022, provisional application No. 63/311,147, filed on Feb. 17, 2022.

(51) Int. Cl.
| | | |
|---|---|---|
| *G01R 31/319* | (2006.01) | |
| *G01R 31/317* | (2006.01) | |
| *G01R 31/3181* | (2006.01) | |
| *G01R 31/3187* | (2006.01) | |

(52) U.S. Cl.
CPC .. *G01R 31/31903* (2013.01); *G01R 31/31724* (2013.01); *G01R 31/31813* (2013.01); *G01R 31/3187* (2013.01)

(58) Field of Classification Search
CPC .............................................. G01R 31/31903
See application file for complete search history.

(56) References Cited

U.S. PATENT DOCUMENTS

| | | | |
|---|---|---|---|
| 7,464,307 B2 | 12/2008 | Nejedlo et al. | |
| 8,386,867 B2 | 2/2013 | Sul et al. | |
| 2008/0034334 A1* | 2/2008 | Laouamri | G01R 31/318505 716/136 |
| 2010/0014526 A1* | 1/2010 | Chavan | H04L 12/467 370/395.53 |
| 2010/0332177 A1* | 12/2010 | Wu | G11C 29/32 702/117 |
| 2012/0012842 A1* | 1/2012 | Kikuchi | H01L 22/32 257/E23.179 |
| 2013/0024737 A1* | 1/2013 | Marinissen | G01R 31/318511 714/E11.155 |
| 2017/0176534 A1* | 6/2017 | Chellappan | G01R 31/3187 |
| 2019/0042380 A1* | 2/2019 | Das Sharma | G06F 13/4295 |
| 2021/0373075 A1* | 12/2021 | Maxon | G01R 31/3187 |

* cited by examiner

*Primary Examiner* — Joseph D Torres (57) ABSTRACT

A system-on-chip integrated circuit device includes a plurality of functional circuit modules, at least a first circuit module of the plurality of functional circuit modules operating under a first protocol, the first protocol being an interface protocol for communicating outside the system-on-chip integrated circuit device, an interconnect fabric coupled to the functional circuit modules in the plurality of functional circuit modules, and a built-in self-test circuit module coupled to the interconnect fabric. The built-in self-test circuit is configured to test one or more selected functional circuit modules in the plurality of functional circuit modules, including at least the first circuit module under the first protocol for communicating outside the system-on-chip integrated circuit device, by routing test data through the one or more selected functional circuit modules.

23 Claims, 2 Drawing Sheets

BUILT-IN TESTING IN MODULAR SYSTEM-ON-CHIP DEVICE

CROSS REFERENCE TO RELATED APPLICATION

This disclosure claims the benefit of commonly-assigned U.S. Provisional Patent Applications Nos. 63/311,147 and 63/417,675, filed Feb. 17, 2022 and Oct. 19, 2022 respectively, each of which is hereby incorporated by reference herein in its respective entirety.

FIELD OF USE

This disclosure relates to built-in self-test circuitry for modular integrated circuit devices. More particularly, this disclosure relates to built-in self-test functionality that allows modules under test to be tested while in the same operational mode used for run-time operations, and that allows testing to include modules that operate under different protocols.

BACKGROUND

The background description provided herein is for the purpose of generally presenting the context of the disclosure. Work of the inventors hereof, to the extent the work is described in this background section, as well as aspects of the description that may not otherwise qualify as prior art at the time of filing, are neither expressly nor impliedly admitted to be prior art against the subject matter of the present disclosure.

An integrated circuit device may be fabricated as a "system-on-chip" incorporating multiple different portions of circuitry (which may be referred to, e.g., as "cores" or "modules") that perform different functions of the integrated circuit device. While the different cores or modules may communicate via an interconnect "fabric" provided on the integrated circuit device, each core or module may have been provided separately, possibly by different entities. Therefore, the different cores or modules may lack the interconnections needed for on-board self-testing, requiring relatively slow and expensive external testing.

SUMMARY

In accordance with implementations of the subject matter of this disclosure, a system-on-chip integrated circuit device includes a plurality of functional circuit modules, at least a first circuit module of the plurality of functional circuit modules operating under a first protocol, the first protocol being an interface protocol for communicating outside the system-on-chip integrated circuit device, an interconnect fabric coupled to the functional circuit modules in the plurality of functional circuit modules, and a built-in self-test circuit module coupled to the interconnect fabric, the built-in self-test circuit being configured to test one or more selected functional circuit modules in the plurality of functional circuit modules, including at least the first circuit module under the first protocol for communicating outside the system-on-chip integrated circuit device, by routing test data through the one or more selected functional circuit modules.

In a first implementation of such a system-on-chip integrated circuit device, the built-in self-test circuit module may include test pattern generation circuitry, test pattern checker circuitry, and test controller circuitry configured to command the test pattern generation circuitry to generate a first test pattern for testing the one or more selected functional circuit modules of the plurality of functional circuit modules of the system-on-chip integrated circuit device, route the first test pattern, via the interconnect fabric, from the test pattern generation circuitry through the one or more selected functional circuit modules, route the first test pattern back to the test pattern checker circuitry, and command the test pattern checker circuitry to compare the first test pattern, as returned via the interconnect fabric after routing through the one or more selected functional circuit modules, to the first test pattern as generated by the test pattern generation circuitry.

A first aspect of that first implementation may further include at least one additional functional circuit module operating under at least one additional protocol different from the first protocol, the at least one additional functional circuit module may operate under the at least one additional protocol, and the built-in self-test circuit module may be configured to also test the at least one additional functional circuit module under the at least one additional protocol.

In a first instance of that first aspect, the test controller circuitry of the built-in self-test circuit module may be configured to also test the at least one additional functional circuit module under the at least one additional protocol by commanding the test pattern generation circuitry to generate an additional test pattern for testing the at least one additional functional circuit module of the system-on-chip integrated circuit device, routing the additional test pattern, via the interconnect fabric, from the test pattern generation circuitry through the at least one additional functional circuit module, and back to the test pattern checker circuitry, and commanding the test pattern checker circuitry to compare the test pattern, as returned via the interconnect fabric after routing through the at least one additional functional circuit module, to the additional test pattern as generated by the test pattern generation circuitry.

In a second instance of that first aspect, the test controller circuitry of the built-in self-test circuit module may be configured to route the first test pattern back to the test pattern checker circuitry by, for testing the at least one additional functional circuit module, commanding that the first test pattern be stored, after routing of the first test pattern, via the interconnect fabric, from the test pattern generation circuitry through the one or more selected functional circuit modules, in a first memory accessible via the interconnect fabric, commanding the at least one additional functional circuit module to retrieve the first test pattern from the first memory and to store the retrieved first test pattern in a second memory accessible via the interconnect fabric, and retrieving the first test pattern from the second memory for routing back to the test pattern checker circuitry.

In a third instance of that first aspect, the test controller circuitry may be further configured to command at least one of the one or more selected functional circuit modules to enter a testing mode.

In a fourth instance of that first aspect, at least one of the functional circuit modules in the plurality of functional circuit modules may include control circuitry configured to route test data via the interconnect fabric through the one or more selected functional circuit modules.

In a second implementation of such a system-on-chip integrated circuit device, the plurality of functional circuit modules may include at least one interface module coupled to the interconnect fabric and configured to operate under an Peripheral Component Interconnect Express protocol, and an Ethernet switch unit coupled to the interconnect fabric and having at least one port configured to operate under an Ethernet protocol.

According to a first aspect of that second implementation, the plurality of functional circuit modules may further include an embedded processor unit coupled to the interconnect fabric and configured to operate under a processor protocol.

In a first instance of that first aspect, the built-in self-test circuit module may be configured to test the at least one interface module under the Peripheral Component Interconnect Express protocol, the at least one port under the Ethernet protocol, and the embedded processor unit under the processor protocol.

In a third implementation of such a system-on-chip integrated circuit device, the first circuit module in the plurality of functional circuit modules may be an interface module including physical layer transceiver circuitry and core circuitry including higher-layer circuitry, and the built-in self-test circuit module may be configured to command the core circuitry to place the interface module, for testing, into a loopback mode in which signals output on a transmit path of the interface module are returned on a receive path of the interface module, for testing without connecting to a link partner outside the system-on-chip integrated circuit device.

According to a first aspect of that third implementation, the first protocol, under which the interface module operates, may be a Peripheral Component Interconnect Express protocol, and the loopback mode may include a protocol loopback that simulates link initialization and link training, and a pin loopback that couples a transmit pin of the interface module to a receive pin of the interface module.

In a first instance of that first aspect, the pin loopback may be an internal loopback.

In accordance with implementations of the subject matter of this disclosure, a method of testing a system-on-chip integrated circuit device having a plurality of functional circuit modules, at least a first circuit module of the plurality of functional circuit modules operating under a first protocol, and an interconnect fabric coupled to the functional circuit modules in the plurality of functional circuit modules, includes using a built-in self-test circuit module coupled to the interconnect fabric to test one or more selected functional circuit modules in the plurality of functional circuit modules, including at least the first circuit module under the first protocol for communicating outside the system-on-chip integrated circuit device, by routing test data through the one or more selected functional circuit modules.

A first implementation of such a method may further include generating in the built-in self-test circuit module a first test pattern for testing the one or more selected functional circuit modules of the plurality of functional circuit modules of the system-on-chip integrated circuit device, routing the first test pattern, via the interconnect fabric, from the built-in self-test circuit module through the one or more selected functional circuit modules, routing the first test pattern back to the built-in self-test circuit module, and comparing, in the built-in self-test circuit module, the first test pattern, as returned via the interconnect fabric after routing through the one or more selected functional circuit modules, to the first test pattern as generated in the built-in self-test circuit module.

A first aspect of that first implementation may further include, when the system-on-chip integrated circuit device includes at least one additional functional circuit module operating under at least one additional protocol different from the first protocol, using the built-in self-test circuit module to also test the at least one additional functional circuit module under the at least one additional protocol.

In a first instance of that first aspect, using the built-in self-test circuit module to also test the at least one additional functional circuit module under the at least one additional protocol may include generating in the built-in self-test circuit module an additional test pattern for testing the at least one additional functional circuit module, routing the additional test pattern, via the interconnect fabric, from the test pattern generation circuitry through the at least one additional functional circuit module, and back to the test pattern checker circuitry, and commanding the test pattern checker circuitry to compare the test pattern, as returned via the interconnect fabric after routing through the at least one additional functional circuit module, to the additional test pattern as generated by the test pattern generation circuitry.

In a second instance of that first aspect, routing the first test pattern back to the test pattern checker circuitry may include, for testing the at least one additional functional circuit module, commanding that the first test pattern be stored, after routing of the first test pattern, via the interconnect fabric, from the test pattern generation circuitry through the one or more selected functional circuit modules, in a first memory accessible via the interconnect fabric, commanding the at least one additional functional circuit module to retrieve the first test pattern from the first memory and to store the retrieved first test pattern in a second memory accessible via the interconnect fabric, and retrieving the first test pattern from the second memory for routing back to the test pattern checker circuitry.

A third instance of that first aspect may further include commanding at least one of the one or more selected functional circuit modules to enter a testing mode.

A fourth instance of that first aspect may further include routing test data from at least one of the functional circuit modules in the plurality of functional circuit modules via the interconnect fabric through the one or more selected functional circuit modules.

A second implementation of such a method may include testing at least one interface module, that is coupled to the interconnect fabric, under an Peripheral Component Interconnect Express protocol, and testing an Ethernet port, that is coupled to the interconnect fabric, under an Ethernet protocol.

A first aspect of that second implementation may further include testing an embedded processor unit, that is coupled to the interconnect fabric, under a processor protocol.

In a third implementation of such a method, when the first circuit module in the plurality of functional circuit modules is an interface module including physical layer transceiver circuitry and core circuitry including higher-layer circuitry, the method may include issuing a command from the built-in self-test circuit module to the core circuitry to place the interface module, for testing, into a loopback mode in which signals output on a transmit path of the interface module are returned on a receive path of the interface module, for testing without connecting to a link partner outside the system-on-chip integrated circuit device.

In a first aspect of that third implementation, when the first protocol, under which the interface module operates, is a Peripheral Component Interconnect Express protocol, issuing a command from the built-in self-test circuit module to the core circuitry to place the interface module into a loopback mode for testing may include issuing the command from the built-in self-test circuit module to the core circuitry to initiate a protocol loopback that simulates link initialization and link training, and a pin loopback that couples a transmit pin of the interface module to a receive pin of the interface module.

BRIEF DESCRIPTION OF THE DRAWINGS

Further features of the disclosure, its nature and various advantages, will be apparent upon consideration of the following detailed description, taken in conjunction with the accompanying drawings, in which like reference characters refer to like parts throughout, and in which.

DETAILED DESCRIPTION

As noted above, an integrated circuit device may be fabricated as a "system-on-chip" (SoC) incorporating multiple different portions of circuitry (which may be referred to, e.g., as "cores" or "modules") that perform different functions of the integrated circuit device. While the different cores or modules may communicate via an interconnect "fabric" provided on the integrated circuit device, each core or module may have been provided separately, possibly by different entities. Therefore, the different cores or modules may lack the interconnections needed for on-board self-testing, requiring relatively slow and expensive external testing, in turn requiring an expensive external test device, as well as, in some cases, the availability of a link partner device to establish a connection to test.

For example, using the illustration of an integrated circuit switch device SoC for an automotive network, which facilitates communication among various vehicle sensors, actuators and controllers, different portions of the integrated circuit switch device may operate in different protocol domains—e.g., PCIe (Peripheral Component Interconnect Express) and Ethernet, as well as the protocol of an embedded processing unit (EPU). Typical built-in self-test methods may not be capable of operating in multiple domains or of crossing domain boundaries. For example, while each of the individual modules in the integrated circuit switch device SoC may include scan-chain paths that can be used for automated self-testing, the scan-chain paths do not typically extend between different modules.

In addition, if a module is capable of operating at different rates, separate testing may be required for each rate. For example, in a PCIe Generation 4 (PCIe/Gen4) device, separate testing may be required for Generation 1 speed, Generation 2 speed, Generation 3 speed and Generation 4 speed, meaning each test may have to be run four separate times.

Moreover, even within a module operating under a particular protocol, devices may operate differently under test than during run-time operation, limiting the meaningfulness of self-testing. For example, different modules may operate at different clock rates during run-time operation, limiting the significance of a self-testing mode operating at a single clock rate.

While automated self-testing can be a relatively fast and inexpensive method for testing integrated circuit devices, the unavailability of automated self-testing for modular SoC devices can make testing of such devices difficult and expensive. This may be of concern in any type of SoC device, but may be of particular concern in devices intended for automotive networks, where safety requirements may dictate very low defect rates—e.g., a defect-parts-per-million (DPPM) rate in the single digits (meaning fewer than ten devices out of every million devices tested can fail). Moreover, it may be desirable in automotive networks to perform testing each time a vehicle is started, which would not be possible if self-testing were not available.

Therefore, in accordance with implementations of the subject matter of this disclosure, a modular integrated circuit device (e.g., a system-on-chip), having multiple modules that operate under separate protocols, may be provided with a built-in self-test functionality that allows modules under test to be tested while in the same operational mode used for run-time operations (including operating at native clock rates), and that allows testing to include modules that operate under different protocols.

The built-in self-test functionality may be provided by a built-in self-test circuit module that itself has access to the interconnection fabric. The built-in self-test circuit module includes test controller circuitry to orchestrate all of the functions included in testing the other circuit modules on the system-in-chip integrated circuit device. The built-in self-test circuit module may also include pattern generation circuitry capable of generating test patterns of data that may be propagated through the circuit modules under test, and pattern checking circuitry to examine the test data pattern that is returned after propagation through the circuit module or modules under test. The pattern checking circuitry may check to see that the test data pattern is unaltered, or (in cases where may be expected alterations in the test data pattern) is not altered in an unexpected way.

In accordance with implementations of the subject matter of this disclosure, the built-in self-test circuit module may also include a protocol control unit capable of issuing commands to a circuit module under test in the native protocol of the circuit module under test—e.g., to place the circuit module under test into a test mode. While such a test mode may be nearly identical to the normal operational mode in most respects (including, e.g., native clock rates for each circuit module under test)—so that the self-testing is meaningful—the test mode may accommodate looping back of signals that ordinarily would be exchanged with a link partner, and may alter any link training requirements accordingly. In some implementations, where the system-on-chip integrated circuit device includes different protocol domains—i.e., circuit modules operating under different protocols—the built-in self-test circuit module may include a respective protocol control unit for each of the protocol domains, or a protocol control unit capable of handling multiple protocols.

As one illustration, where the circuit module under test is a PCIe interface, the built-in self-test circuit module may include a PCIe control unit, or a multi-protocol control unit including PCIe protocols, which can set the PCIe circuit module under test to a loopback mode as defined in the PCIe specification. That loopback mode includes a protocol loopback, simulating link initialization and training of a link, as well as an internal loopback of the transmit and receive terminals of a physical layer transceiver (PHY) of the PCIe interface circuit module.

The availability of an internal loopback allows testing of the system-on-chip integrated circuit device in the field, without the need for separate automated test equipment. This capability may be used in applications, such as, e.g., automotive applications, where, for safety purposes, testing may be performed each time the system-on-chip integrated circuit device starts up. However, the internal PHY loopback need not be used in situations in which the system-on-chip integrated circuit device is tested in automated test equipment that couples the transmit and receive pins in an external pin loopback. Nevertheless, even where automated test equipment is used with an external pin loopback, the PCIe circuit module may still be placed in the protocol loopback mode.

As described in more detail below, once the PCIe circuit module under test is in the loopback mode, the built-in self-test circuit module may send a test pattern, via the interconnection fabric of the system-on-chip integrated circuit device through the various components of the looped-back PCIe circuit module under test and back to the built-in self-test circuit module where the pattern checking circuitry can check that the test pattern has not been altered, or has been altered only in an expected way. Alternatively, the test pattern may be routed, before or after leaving the PCIe circuit module under test, through other circuit modules which may operate under the PCIe protocol, or under other protocols supported by the built-in self-test circuit module.

The other circuit modules may be one or more embedded processor units (EPUs) operating under an EPU protocol, as well as to various other modules, which may include memories, some of which may have bus master capabilities, including DMA (Direct Memory Access) capabilities, and connect through an Ethernet Switch Unit (ESU) under an ESU protocol, or through a device interconnect fabric. Various combinations of operations can be performed to test these various modules.

In some implementations, the built-in self-test circuit module may initiate reading and/or writing to one or more of those other EPU or ESU circuit modules as part of self-testing. In other implementations, the built-in self-test circuit module can write a test data pattern to a memory in another circuit module, and can send instructions for execution by one of the circuit modules with bus master capabilities. That bus master module can then execute those instructions, initiating a transfer of data previously stored by the built-in self-test circuit module in one of the memory modules and storing that data in its own memory or the memory of another circuit module. The built-in self-test circuit module can then retrieve that data and the pattern checking circuitry in the built-in self-test circuit module can check whether the data has been changed in an unexpected way.

Such implementations can be used to conduct testing that effectively crosses protocol domains. That is, the built-in self-test circuit module can route a first test data pattern through one or more modules in a first protocol domain, for storage in the memory of one of the modules. The built-in self-test circuit module can then retrieve that stored first test data pattern and route the retrieved first test data pattern through one or more modules in a second protocol domain, or can instruct another circuit module with bus master capabilities to retrieve and route the stored first test data pattern through the second protocol domain. The retrieved first test data pattern can be returned to the built-in self-test circuit module for checking as described below, or can be stored again for retrieval and routing through yet another protocol domain, and this process can be repeated for as many protocol domains as need to be tested. Ultimately, in some implementations, to return the first test data pattern the built-in self-test circuit module for checking, the first test data pattern may be stored at the end of testing of the final protocol domain to be tested, and then retrieved by the built-in self-test circuit module. In addition, as an alternative to routing the same test data pattern through all of the different protocol domains, the built-in self-test circuit module can generate an additional test data pattern for one or more of the additional protocol domains, and route the additional test data pattern or patterns through one or more modules in one or more of the additional protocol domains in a similar manner as just described for the first test data pattern.

Figure 1:
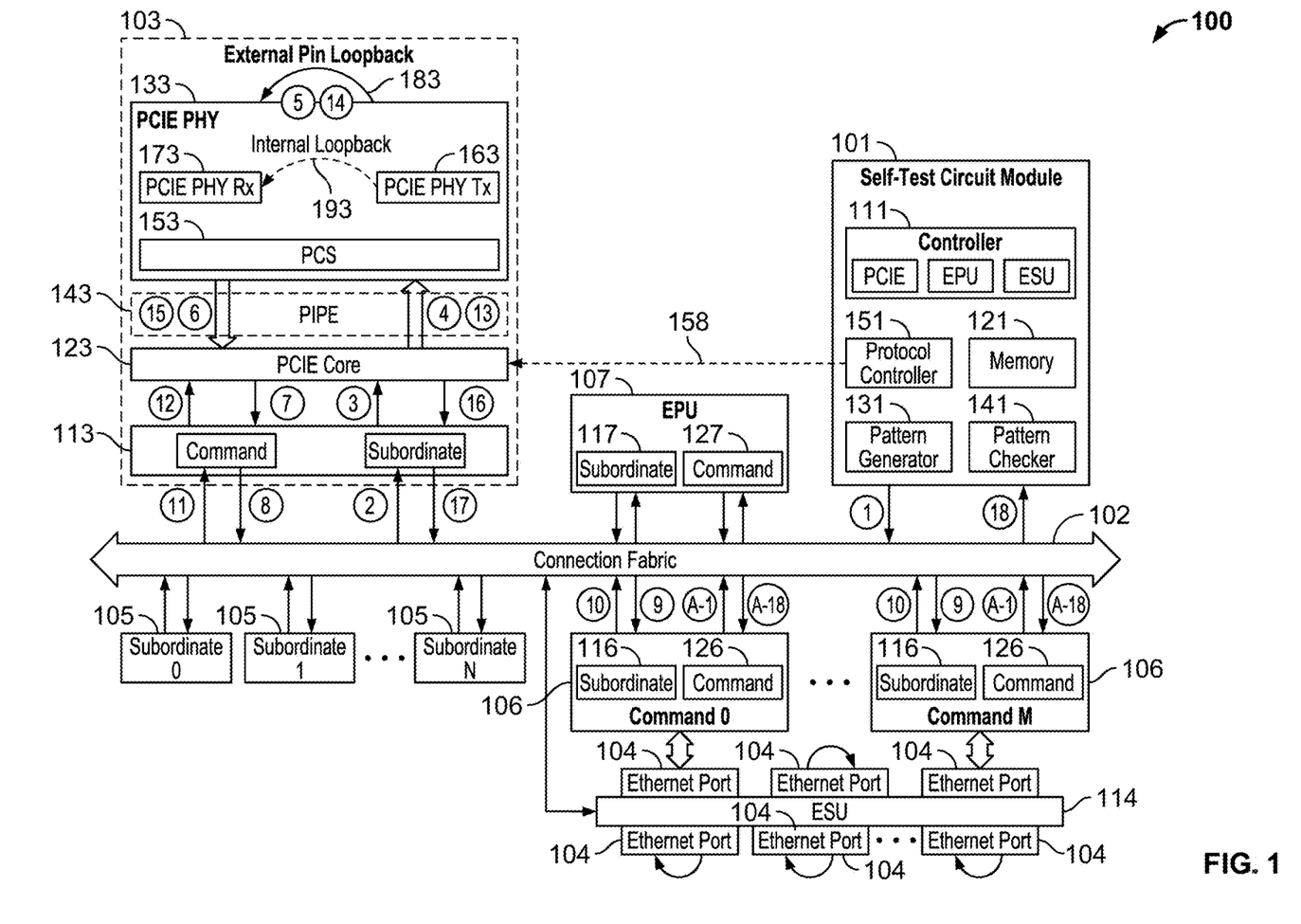
FIG. 1 is a partial block diagram of a system-on-chip integrated circuit device incorporating a self-test circuit module according to implementations of the subject matter of this disclosure.
Figure 2:
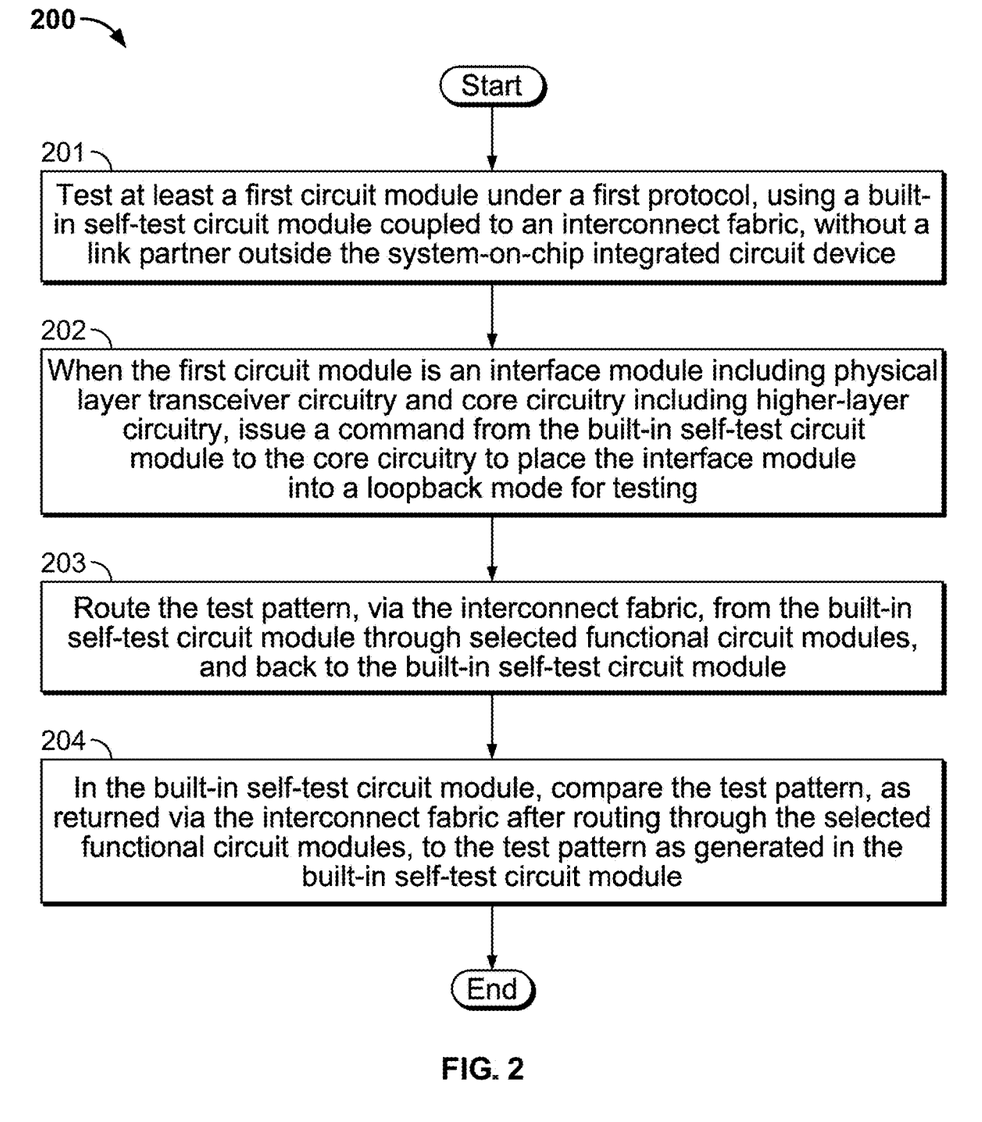
FIG. 2 is a flow diagram illustrating implementations of a method in accordance with the subject matter of this disclosure.

The subject matter of this disclosure may be better understood by reference to FIGS. 1 and 2.

FIG. 1 shows portions of a system-on-chip integrated circuit device 100 incorporating a self-test circuit module 101 according to implementations of the subject matter of this disclosure. System-on-chip integrated circuit device 100 may include a plurality of functional circuit modules coupled by an interconnection fabric 102. Although the functional circuit modules may include any type of functional circuitry, in the implementation illustrated in FIG. 1, system-on-chip integrated circuit device 100 may be a switch device, such as may be used in an onboard vehicle network. As such, among the many functional circuit modules of system-on-chip integrated circuit device 100 are communication modules such as PCIe interface module 103 for communications with other devices according to the PCIe protocol, and Ethernet ports 104 for communications with other devices according to the Ethernet protocol. Ethernet ports 104 may be coupled to interconnection fabric 102 via an Ethernet switch unit 114.

Although only one PCIe interface module 103 is shown, there may be any number of PCIe modules 103, constituting a PCIe domain of system-on-chip integrated circuit device 100. Similarly, there may be any number of Ethernet ports 104, constituting an Ethernet Switch Unit (ESU) domain of system-on-chip integrated circuit device 100.

There may be other circuit modules on system-on-chip integrated circuit device 100 that are not communication modules. For example, N+1 subordinate modules 0 through N (105) may be accessed via interconnection fabric 102 by other circuit modules of system-on-chip integrated circuit device 100. While subordinate modules 105 may not be able to initiate activity, they may receive commands from other circuit modules. For example, subordinate modules 105 may include registers or other memory elements which can be configured or written to by other circuit modules.

In addition, M+1 command modules 0 through M (106) may include subordinate circuits 116 that, like subordinate modules 105, are memories or registers that may be written to or configured by other modules, but command modules 106 also include command circuits 126 (e.g., "bus masters") that can initiate activity, including DMA activity to write to subordinate modules 105 or subordinate circuits 116 of command modules 106. Any one command circuit 126 may be able to access subordinate circuit 116 of its own command module 106 as well as other subordinate modules 105 and subordinate circuits 116 of other command modules 106. A command circuit 126 also may fetch data from its own subordinate circuit 116 for transmission to other circuit modules.

Another type of functional circuit that may be present in system-on-chip integrated circuit device 100 is an embedded processing unit 107. Although only one embedded processing unit 107 is shown, there may be multiple embedded processing units 107. Each embedded processing unit 107 may have its own subordinate circuit 117 and command circuit 127.

Each of the different communication protocols (e.g., PCIe or Ethernet) used on system-on-chip integrated circuit device 100 may form its own protocol "domain" with its own command language. Similarly, EPUs 107 may use a command language that establishes an EPU domain. As discussed above, in order to perform self-testing in accordance with implementations of the subject matter of this disclosure, where a system-on-chip integrated circuit device 100 includes one or more command domains, self-test circuit module 101 is a capable of controlling devices in at least one domain of system-on-chip integrated circuit device 100 to place those devices in a test mode that allows propagation of test data patterns without the need for any external link partner.

Self-test circuit module 101 may include a controller 111 that is configured to control the self-test operations in of one or more command domains on system-on-chip integrated circuit device 100. It would be within the subject matter of this disclosure for controller 111 to be capable of operating in any one or more of whatever command domain or domains are present on system-on-chip integrated circuit device 100, but as illustrated, controller 111 is capable of operating in PCIe, EPU and ESU domains, which may be all of the domains present on system-on-chip integrated circuit device 100, or may be only a subset of the domains present on system-on-chip integrated circuit device 100. Alternatively, there may be even fewer—as few as one—domains on system-on-chip integrated circuit device 100, and in such a case controller 111 would be capable of operating in that smaller number of domains.

Self-test circuit module 101 also includes working memory 121 for use by controller 111. A pattern generator 131 as described above is configured to generate test data patterns for use in self-testing controlled by controller 111, and pattern checker 141 is configured to examine those test patterns after they have been propagated through system-on-chip integrated circuit device 100 and returned to self-test circuit module 101. Finally, a protocol controller 151 may be configured to issue commands, as described above, to components under test, in their respective native command protocols, to place those components into testing mode. Alternatively, there may be a plurality (not shown) of protocol controllers, each of which operates under only one protocol, to issue commands to the respective components under their respective command protocols.

An illustration of a testing operation may be visualized with respect to PCIe interface module 103. The testing operation may be better understood upon review of the components of PCIe interface module 103, including a submodule 113 that couples to interconnection fabric 102. PCIe "core" circuitry 123 performs the command functions of PCIe interface module 103, and transfers data between submodule 113 and PCIe physical layer transceiver (PHY) submodule 133 over PIPE circuitry 143. PCIe PHY submodule 133 includes Physical Coding Sublayer circuitry 153, transmit circuitry 163 and receive circuitry 173. Transmit circuitry 163 and receive circuitry 173 may be coupled to external pins, which may be physically configured for loopback as at 183, which may occur in a separate test apparatus. Alternatively, PCIe core circuitry may be capable of configuring an internal loopback path 193.

In order to perform testing of PCIe interface module 103, controller 111 of self-test circuit module 101 is capable of operating in at least the PCIe protocol domain, and issues, via protocol controller 151, PCIe commands to PCIe core circuitry 123 of PCIe interface module 103 to enter a testing mode, including, in lieu of link training with an external link partner, establishing pathways for test data, such as configuring internal loopback path 193.

The commands from controller 111 to PCIe core circuitry 123 via protocol controller 151 are sent during a setup operation before testing begins, as indicated by dashed line 158. Those setup commands may set registers in PCIe core circuitry 123, including Command registers and Base Address registers. The commands written to those registers not only configure internal loopback path 193, but may also initiate training of the PCIe link for loopback operations at all link speeds to be tested, with the tests to be performed at the different speeds sequentially.

Each test operation is indicated in FIG. 1 by a circled numeral. For example, a circled "1" designates Test Operation 1. There are also an Alternative Test Operation 1 indicated by a circled "A-1" an Alternative Test Operation 18 indicated by a circled "A-18."

Once the PCIe link has been established in a loopback mode, in Test Operation 1, self-test control module 101 may start generating test packets in pattern generator 131. In Test Operation 2, those packets may pass through PCIe data subordinate of submodule 113. In Test Operation 3, those packets may pass through PCIe core circuitry 123. In Test Operation 4, those packets may pass through the transmit side of PIPE circuitry 143. In Test Operation 5, those packets may pass through PCIe PHY 133 over internal loopback 193 (although self-test circuit module 101 also may set a test path over external pin loopback 183 if an external test device is being used). In Test Operation 6, those packets may pass through the receive side of PIPE circuitry 143. In Test Operation 7, those packets may pass back through PCIe core circuitry 123 and in Test Operation 8, the packets may pass through command circuitry of submodule 113. In Test Operation 9, the command circuitry of submodule 113 may select a destination data subordinate 116 of one of command modules 106.

To complete the testing, self-test circuit module 101 then issues a command to fetch the data from data subordinate 116, which returns the requested data in Test Operation 10. The read data retraces the original data path in Test Operations 11 (command circuitry of submodule 113), 12 (PCIe core circuitry 123), 13 (transmit side of PIPE circuitry 143), 14 (loopback 193), 15 (receive side of PIPE circuitry 143), 16 (PCIe core circuitry 123) and 17 (data subordinate of submodule 113). In Test Operation 18, the data is received at pattern checker 141 where it is determined whether any errors were introduced in transit.

Using such a sequence of test operations, self-test circuit module 101 can test the data path not only through PCIe interface module 103, but also through any selected data command circuitry and/or subordinate data circuitry coupled to interconnect fabric 102.

For example, in a variation of a sequence of operations as described above, self-test circuit module 101 can write, to the subordinate circuit 116 of one of command modules 106, data which includes not only a test pattern but also commands for execution by the command circuit 126 of that command module 106. In an alternate sequence of operations, command circuit 126 may execute those commands, propagating, at Test Operation A-1, the test pattern (that had been stored by self-test circuit module 101 in subordinate circuit 116 of command module 106) through, for example, PCIe interface module 103 in a sequence similar to the original sequence, including Test Operations 2 through 17. Instead of returning the propagated test pattern back to pattern checker 141 of self-test circuit module 101 in a Test Operation 18, the commands from command circuit 126 may cause the test pattern to be returned, in a Test Operation A-18, to the originating command module 106, where the returned test pattern may be stored in subordinate circuit 116 of that command module 106. Alternatively, in Test Operation A-18, the test pattern may be returned to and stored in subordinate circuit 116 of a different one of command modules 106. In a further operation, self-test circuit module 101 can retrieve the test pattern from subordinate circuit 116 of whichever command module 106 it has been stored in, and return the pattern to be checked by pattern checking circuitry 141.

In still another variation, self-test circuit module 101 can write, to the subordinate circuit 116 of one of command modules 106, data which includes a test pattern and also commands for execution by the command circuit 126 of that command module 106. That command circuit 126 can test the Ethernet switch unit 114 by routing the test pattern through one of Ethernet ports 104 into Ethernet switch unit 114 and back through a different one of Ethernet ports 104 and back to command circuit 126. Command circuit 126 can then transfer the test pattern to any subordinate circuit 116 of any command module 106 via, e.g., interconnect fabric 102 and PCIe interface module 103. Self-test circuit module 101 can then retrieve the test pattern from the selected subordinate circuit 116 of the selected command module 106, and return the pattern to be checked by pattern checking circuitry 141. Similarly, self-test circuit module 101 can command that data be routed through EPU 107 for testing.

FIG. 2 is a flow diagram illustrating a method 200 in accordance with implementations of the subject matter of this disclosure for testing a system-on-chip integrated circuit device having a plurality of functional circuit modules. Method 200 begins at 201 where a built-in self-test circuit module coupled to an interconnect fabric is used to test at least the first circuit module under the first protocol without a link partner outside the system-on-chip integrated circuit device. At 202, when the first circuit module in the plurality of functional circuit modules is an interface module including physical layer transceiver circuitry and core circuitry including higher-layer circuitry, a command is issued from the built-in self-test circuit module to the core circuitry to place the interface module into a loopback mode for testing. At 203, the test pattern is routed, via the interconnect fabric, from the built-in self-test circuit module through selected functional circuit modules, and back to the built-in self-test circuit module. At 204, the test pattern, as returned via the interconnect fabric after routing through the selected functional circuit modules, is compared, in the built-in self-test circuit module, to the test pattern as generated in the built-in self-test circuit module. Method 200 then ends.

Thus it is seen that built-in self-test circuitry for modular integrated circuit devices, that allows modules under test to be tested while in the same operational mode used for run-time operations, and that allows testing to include modules that operate under different protocols, has been provided.

As used herein and in the claims which follow, the construction "one of A and B" shall mean "A or B."

It is noted that the foregoing is only illustrative of the principles of the invention, and that the invention can be practiced by other than the described embodiments, which are presented for purposes of illustration and not of limitation, and the present invention is limited only by the claims which follow.

What is claimed is:

1. A system-on-chip integrated circuit device, comprising:
a plurality of functional circuit modules located on the system-on-chip integrated device, at least a first circuit module of the plurality of functional circuit modules operating under a Peripheral Component Interconnect Express (PCIe) protocol, the PCIe protocol being an interface protocol for communicating outside the system-on-chip integrated circuit device;
an interconnect fabric coupled to the functional circuit modules in the plurality of functional circuit modules; and
a built-in self-test circuit module coupled to the interconnect fabric, the built-in self-test circuit being configured to, each time the system-on-chip integrated circuit device is started up, (a) test one or more selected functional circuit modules in the plurality of functional circuit modules, including at least the first circuit module under the PCIe protocol for communicating outside the system-on-chip integrated circuit device, by routing test data through the one or more selected functional circuit modules and (b) place the first circuit module, for testing, into a loopback mode that comprises a protocol loopback that simulates link initialization and link training, and a pin loopback that couples a transmit pin of the interface module to a receive pin of the interface module.

2. The system-on-chip integrated circuit device of claim 1, wherein the built-in self-test circuit module comprises:
test pattern generation circuitry;
test pattern checker circuitry; and
test controller circuitry configured to:
command the test pattern generation circuitry to generate a first test pattern for testing the one or more selected functional circuit modules of the plurality of functional circuit modules of the system-on-chip integrated circuit device,
route the first test pattern, via the interconnect fabric, from the test pattern generation circuitry through the one or more selected functional circuit modules,
route the first test pattern back to the test pattern checker circuitry, and
command the test pattern checker circuitry to compare the first test pattern, as returned via the interconnect fabric after routing through the one or more selected functional circuit modules, to the first test pattern as generated by the test pattern generation circuitry.

3. The system-on-chip integrated circuit device of claim 2, further comprising at least one additional functional circuit module operating under at least one additional protocol different from the PCIe protocol; wherein:
the at least one additional functional circuit module operates under the at least one additional protocol; and
the built-in self-test circuit module is configured to also test the at least one additional functional circuit module under the at least one additional protocol.

4. The system-on-chip integrated circuit device of claim 3, wherein the test controller circuitry of the built-in self-test circuit module is configured to also test the at least one additional functional circuit module under the at least one additional protocol by:
commanding the test pattern generation circuitry to generate an additional test pattern for testing the at least one additional functional circuit module of the system-on-chip integrated circuit device;
routing the additional test pattern, via the interconnect fabric, from the test pattern generation circuitry through the at least one additional functional circuit module, and back to the test pattern checker circuitry; and
commanding the test pattern checker circuitry to compare the test pattern, as returned via the interconnect fabric after routing through the at least one additional functional circuit module, to the additional test pattern as generated by the test pattern generation circuitry.

5. The system-on-chip integrated circuit device of claim 3, wherein the test controller circuitry of the built-in self-test circuit module is configured to route the first test pattern back to the test pattern checker circuitry by, for testing the at least one additional functional circuit module:
commanding that the first test pattern be stored, after routing of the first test pattern, via the interconnect fabric, from the test pattern generation circuitry through the one or more selected functional circuit modules, in a first memory accessible via the interconnect fabric;
commanding the at least one additional functional circuit module to retrieve the first test pattern from the first memory and to store the retrieved first test pattern in a second memory accessible via the interconnect fabric; and
retrieving the first test pattern from the second memory for routing back to the test pattern checker circuitry.

6. The system-on-chip integrated circuit device of claim 3, wherein the test controller circuitry is further configured to command at least one of the one or more selected functional circuit modules to enter a testing mode.

7. The system-on-chip integrated circuit device of claim 3, wherein at least one of the functional circuit modules in the plurality of functional circuit modules comprises control circuitry configured to route test data via the interconnect fabric through the one or more selected functional circuit modules.

8. The system-on-chip integrated circuit device of claim 1, wherein the plurality of functional circuit modules comprises:
at least one interface module coupled to the interconnect fabric and configured to operate under a Peripheral Component Interconnect Express protocol; and
an Ethernet switch unit coupled to the interconnect fabric and having at least one port configured to operate under an Ethernet protocol.

9. The system-on-chip integrated circuit device of claim 8, wherein the plurality of functional circuit modules further comprises an embedded processor unit coupled to the interconnect fabric and configured to operate under a processor protocol.

10. The system-on-chip integrated circuit device of claim 9, wherein the built-in self-test circuit module is configured to test the at least one interface module under the Peripheral Component Interconnect Express protocol, the at least one port under the Ethernet protocol, and the embedded processor unit under the processor protocol.

11. The system-on-chip integrated circuit device of claim 1, wherein:
the first circuit module in the plurality of functional circuit modules is an interface module including physical layer transceiver circuitry and core circuitry including higher-layer circuitry; and
the built-in self-test circuit module is configured to command the core circuitry to place the interface module, for testing, into the loopback mode in which signals output on a transmit path of the interface module are returned on a receive path of the interface module, for testing without connecting to a link partner outside the system-on-chip integrated circuit device.

12. The system-on-chip integrated circuit device of claim 1, wherein the pin loopback is an internal loopback.

13. A method of testing a system-on-chip integrated circuit device having a plurality of functional circuit modules located on the system-on-chip integrated device, at least a first circuit module of the plurality of functional circuit modules operating under a Peripheral Component Interconnect Express (PCIe) protocol, and an interconnect fabric coupled to the functional circuit modules in the plurality of functional circuit modules, the method comprising:
using a built-in self-test circuit module coupled to the interconnect fabric to, each time the system-on-chip integrated circuit device is started up, (a) test one or more selected functional circuit modules in the plurality of functional circuit modules, including at least the first circuit module under the PCIe protocol for communicating outside the system-on-chip integrated circuit device, by routing test data through the one or more selected functional circuit modules, and (b) place the first circuit module, for testing, into a loopback mode that comprises a protocol loopback that simulates link initialization and link training, and a pin loopback that couples a transmit pin of the interface module to a receive pin of the interface module.

14. The method of testing a system-on-chip integrated circuit device according to claim 13, further comprising:
generating in the built-in self-test circuit module a first test pattern for testing the one or more selected functional circuit modules of the plurality of functional circuit modules of the system-on-chip integrated circuit device;
routing the first test pattern, via the interconnect fabric, from the built-in self-test circuit module through the one or more selected functional circuit modules;
routing the first test pattern back to the built-in self-test circuit module; and
comparing, in the built-in self-test circuit module, the first test pattern, as returned via the interconnect fabric after routing through the one or more selected functional circuit modules, to the first test pattern as generated in the built-in self-test circuit module.

15. The method of testing a system-on-chip integrated circuit device according to claim 14, further comprising, when the system-on-chip integrated circuit device includes at least one additional functional circuit module operating under at least one additional protocol different from the first protocol:
using the built-in self-test circuit module to also test the at least one additional functional circuit module under the at least one additional protocol.

16. The method of testing a system-on-chip integrated circuit device according to claim 15, wherein using the built-in self-test circuit module to also test the at least one additional functional circuit module under the at least one additional protocol comprises:
generating in the built-in self-test circuit module an additional test pattern for testing the at least one additional functional circuit module;
routing the additional test pattern, via the interconnect fabric, from the test pattern generation circuitry through the at least one additional functional circuit module, and back to the test pattern checker circuitry; and
commanding the test pattern checker circuitry to compare the test pattern, as returned via the interconnect fabric after routing through the at least one additional functional circuit module, to the additional test pattern as generated by the test pattern generation circuitry.

17. The system-on-chip integrated circuit device of claim 15, wherein routing the first test pattern back to the test pattern checker circuitry comprises, for testing the at least one additional functional circuit module:
- commanding that the first test pattern be stored, after routing of the first test pattern, via the interconnect fabric, from the test pattern generation circuitry through the one or more selected functional circuit modules, in a first memory accessible via the interconnect fabric;
- commanding the at least one additional functional circuit module to retrieve the first test pattern from the first memory and to store the retrieved first test pattern in a second memory accessible via the interconnect fabric; and
- retrieving the first test pattern from the second memory for routing back to the test pattern checker circuitry.

18. The method of testing a system-on-chip integrated circuit device according to claim 15, further comprising commanding at least one of the one or more selected functional circuit modules to enter a testing mode.

19. The method of testing a system-on-chip integrated circuit device according to claim 15, further comprising routing test data from at least one of the functional circuit modules in the plurality of functional circuit modules via the interconnect fabric through the one or more selected functional circuit modules.

20. The method of testing a system-on-chip integrated circuit device according to claim 13, comprising:
- testing at least one interface module, that is coupled to the interconnect fabric, under a Peripheral Component Interconnect Express protocol; and
- testing an Ethernet port, that is coupled to the interconnect fabric, under an Ethernet protocol.

21. The method of testing a system-on-chip integrated circuit device according to claim 20, further comprising testing an embedded processor unit, that is coupled to the interconnect fabric, under a processor protocol.

22. The method of testing a system-on-chip integrated circuit device according to claim 13, wherein, when the first circuit module in the plurality of functional circuit modules is an interface module including physical layer transceiver circuitry and core circuitry including higher-layer circuitry, the method comprises:
- issuing a command from the built-in self-test circuit module to the core circuitry to place the interface module, for testing, into the loopback mode in which signals output on a transmit path of the interface module are returned on a receive path of the interface module, for testing without connecting to a link partner outside the system-on-chip integrated circuit device.

23. The method of testing a system-on-chip integrated circuit device according to claim 22, wherein issuing a command from the built-in self-test circuit module to the core circuitry to place the interface module into the loopback mode for testing comprises:
- issuing the command from the built-in self-test circuit module to the core circuitry to initiate the pin loopback as an internal loopback.

* * * * *